United States Patent [19]

Dearnaley et al.

[11] Patent Number: 5,780,119
[45] Date of Patent: *Jul. 14, 1998

[54] TREATMENTS TO REDUCE FRICTION AND WEAR ON METAL ALLOY COMPONENTS

[75] Inventors: Geoffrey Dearnaley; James Lankford, Jr., both of San Antonio, Tex.

[73] Assignee: Southwest Research Institute, San Antonio, Tex.

[*] Notice: The term of this patent shall not extend beyond the expiration date of Pat. No. 5,593,719.

[21] Appl. No.: 618,568

[22] Filed: Mar. 20, 1996

[51] Int. Cl.⁶ .............................. B05D 3/06; C23C 16/26
[52] U.S. Cl. .................. 427/528; 427/525; 427/527; 427/530; 427/2.26; 427/249; 427/402; 623/18; 623/19; 623/20
[58] Field of Search ........................... 427/530, 528, 427/249, 527, 122, 402, 2.26, 525; 623/18, 19, 20

[56] References Cited

U.S. PATENT DOCUMENTS

| | | |
|---|---|---|
| 3,662,440 | 5/1972 | Snedeker et al. . |
| 3,707,006 | 12/1972 | Bokoros et al. . |
| 3,717,522 | 2/1973 | Shirato et al. . |
| 4,362,681 | 12/1982 | Spector et al. . |
| 4,410,611 | 10/1983 | MacIver . |
| 4,452,827 | 6/1984 | Kolev et al. . |
| 4,465,715 | 8/1984 | Manabe et al. . |
| 4,486,286 | 12/1984 | Lewin et al. . |
| 4,495,044 | 1/1985 | Banks . |
| 4,554,208 | 11/1985 | MacIver et al. . |
| 4,647,494 | 3/1987 | Meyerson et al. . |
| 4,698,236 | 10/1987 | Kellogg et al. . |
| 4,725,345 | 2/1988 | Sakamoto et al. . |
| 4,743,493 | 5/1988 | Sioshansi et al. . |
| 4,746,538 | 5/1988 | Mackowski . |
| 4,756,964 | 7/1988 | Kincaid et al. . |
| 4,770,902 | 9/1988 | Barlow et al. . |
| 4,772,513 | 9/1988 | Sakamoto et al. . |
| 4,778,469 | 10/1988 | Lin et al. . |
| 4,822,355 | 4/1989 | Bhuvaneshwar . |
| 4,822,466 | 4/1989 | Rabalais et al. . |
| 4,842,937 | 6/1989 | Meyer et al. . |
| 4,877,677 | 10/1989 | Hirochi et al. . |
| 4,961,958 | 10/1990 | Desphandey et al. . |
| 4,966,803 | 10/1990 | Pluyter et al. . |
| 4,981,071 | 1/1991 | Enke . |
| 4,988,421 | 1/1991 | Drawl et al. . |
| 4,992,153 | 2/1991 | Bergmann et al. . |
| 4,992,298 | 2/1991 | Deutchman et al. . |
| 5,009,923 | 4/1991 | Ogata et al. . |
| 5,028,451 | 7/1991 | Ito et al. . |
| 5,064,682 | 11/1991 | Kiyama et al. . |
| 5,084,151 | 1/1992 | Vallana et al. . |
| 5,130,161 | 7/1992 | Mansur et al. . |
| 5,133,757 | 7/1992 | Sioshansi et al. . |
| 5,133,845 | 7/1992 | Vallana et al. . |
| 5,135,808 | 8/1992 | Kimock et al. . |
| 5,169,597 | 12/1992 | Davidson et al. . |
| 5,176,710 | 1/1993 | Hahn et al. . |
| 5,192,330 | 3/1993 | Chang et al. . |
| 5,192,523 | 3/1993 | Wu et al. . |
| 5,219,363 | 6/1993 | Crowninshield et al. . |
| 5,223,045 | 6/1993 | Priceman . |
| 5,228,451 | 7/1993 | Bales et al. . |
| 5,232,568 | 8/1993 | Parent et al. . |
| 5,246,884 | 9/1993 | Jaso et al. . |
| 5,249,554 | 10/1993 | Tamor et al. . |
| 5,252,174 | 10/1993 | Deguchi et al. . |
| 5,270,252 | 12/1993 | Papanicolaou . |
| 5,314,492 | 5/1994 | Hamilton et al. . |
| 5,391,407 | 2/1995 | Dearnaley . |
| 5,415,704 | 5/1995 | Davidson . |
| 5,425,777 | 6/1995 | Sarkisian et al. . |
| 5,593,719 | 1/1997 | Dearnaley et al. ............ 427/2.26 |
| 5,645,900 | 7/1997 | Ong et al. . |

FOREIGN PATENT DOCUMENTS

| | | |
|---|---|---|
| 0 548 788 | 6/1993 | European Pat. Off. . |
| 0 548 799 A1 | 6/1993 | European Pat. Off. . |
| 62-196371 | 8/1987 | Japan . |
| 62-202897 | 9/1987 | Japan . |
| 1147067-A | 6/1989 | Japan . |

OTHER PUBLICATIONS

Palshin et al, Thin Solid Films 270 (1995) pp. 165–172.

Browne, Malcolm W., "Diamond Coating May be Future of Tool Manufacture," Article in San Antonio Express News (Apr. 1, 1996).

J. Lankford, et al., "Adherence of Diamondlike Carbon Coatings on total Joint Substrate Materials," *Nuclear Instruments and Methods in Physics Research B80/81*, Part II, 1993, 1441–1445.

John H. Dumbleton, Ph.K., "The Clinical Significance of Wear in Total Hip and Knee Prostheses," *Journal of Biomaterials Applications*, 3, Jul. 1988, 3, 10–32.

G. Dearnaley, et al., "Bioapplications of Diamond–like Carbon Coatings," 4th World Biomaterials Congress, Berlin, Apr. 1992.

A.M. Jones, et al., "Stress and Microstructure of Diamond–like Carbon from Ion–beam Decomposition of Hydrocarbon Precursors," 2nd European Conference on Diamond, Diamond–like and Related Coatings, Nice, France, Sep. 2–6, 1991.

C.J. Bedell, et al., "Diamond–like Carbon from the Ion–beam Decomposition of Polyphenyl Ether," *Applications of Diamond Films & Related Materials*, 1991, 833–838.

J.A. Davidson, Ph.D., et al., "Surface Modification Issues for Orthopaedic Implant Bearing Surfaces," *Surface Modification Technologies V*, 1992, 1–14.

P. Bodo, et al., "Adhesion of Evaporated Titanium to Polyethylene: Effects of Ion Bombardment Pretreatment," *J. Vac. Sci A 2*, Oct.–Dec. 1994, 1498–1502.

(List continued on next page.)

*Primary Examiner*—Roy V. King
*Attorney, Agent, or Firm*—Madan & Morris, PLLC

[57] ABSTRACT

The present invention provides a method for strongly adhering a diamond-like carbon coating to a metal alloy substrate using ion beam assisted deposition of silicon and/or germanium followed by ion beam assisted deposition of diamond-like carbon.

14 Claims, 2 Drawing Sheets

OTHER PUBLICATIONS

P. Gao, et al., "Surface Treatment of Ultra High Molecular Weight Polyethylene to Enhance adhesion and Conductivity Properties" presented at Physical Aspects of Polymer Science, Sep., 9–11, 1991, Univ. of Leeks, UK.

A.C. Evans, et al., "Diamond–like Carbon Applied to Bioengineering Materials," *Medical Device Technology*, May 1991, 26–29.

C.M. Agralwal, et al., "The Effects of Diamond–Like–Carbon Coatings on the Friction and Wear of Enhanced UHM-WPE–Metal Couples," 19th Annual Meeting of Society for Biomaterials, Apr. 28–May 2, 1993.

L.S. Wielunski, et al., "Improvement of Thermally Formed Nickel Silicide by Ion Irradiation," *J. Vac. Sci. Technol.*, 20(2), Feb. 1982, 182–184.

R.S. Butter, et al., "Diamond–Like Carbon for Biomedical Applications," Applied Diamond Conference, Aug. 21–24, 683, 688 and 690.

Keith O. Legg, "Surface Engineering with Ion–Assisted Coatings," Nuclear Instruments and Methods in Physics Research B24/25 (1987), pp. 565–67.

G. Dearnaley, "Materials Science Aspects of Ion Beam Technology," Surface Engineering, vol. 7, No. 2 (1991), pp. 127–36.

TREATMENTS TO REDUCE FRICTION AND WEAR ON METAL ALLOY COMPONENTS

FIELD OF THE INVENTION

The present invention provides a method for strongly adhering a diamond-like carbon coating to the surface of a metal alloy component to reduce frictional wear between the metal alloy component and abutting components.

BACKGROUND OF THE INVENTION

One problem that can cause failure or a limited service life in a total joint replacement is known as ball-cup friction and wear. Ball-cup friction and wear results from frictional wear between the hemispherical bearing, which typically is "lined" with ultra high molecular weight polyethylene (UHMWPE), and the polished spherical ceramic or metal ball attached to the stem.

One way to reduce friction and wear between the metal and UHMWPE components would be to coat one or both of the components with diamond-like carbon (DLC), which is chemically inert, biocompatible, and is known to have a low coefficient of friction. Unfortunately, the very properties of DLC that make it a desirable coating for parts that will be frictionally engaged make it difficult to achieve strong adhesion of the DLC coating to the substrate, particularly where deposition temperatures must be low. This limited adhesion problem can be exacerbated by very high compressive stress, such as that found in a plasma-deposited DLC (up to 8 GPa). Therefore, some have concluded that DLC—or at least plasma-deposited DLC—cannot be used in orthopaedic applications.

Energetic ion beam assisted DLC has a far lower residual stress than plasma-deposited DLC, and is a better candidate for a high integrity DLC. The substrate material to which all forms of carbon adhere most successfully is silicon. This is because strong covalent Si—C bonds are easily formed between the coating and the silicon substrate. Some have attempted to improve the adhesion of DLC to other materials, such as metal alloys, by forming an interposed silicon bond-coat to which the DLC will adhere more strongly.

Unfortunately, this simple approach does not result in adhesion that survives in applications where the DLC coating is subjected to substantial friction and stress. The simple formation of a silicon bond-coat on a metal alloy appears to create another relatively weak interface between the silicon and the metal or alloy.

A method is needed by which a DLC coating can be strongly adhered to the surface of a metal alloy.

SUMMARY OF THE INVENTION

Figure 1:
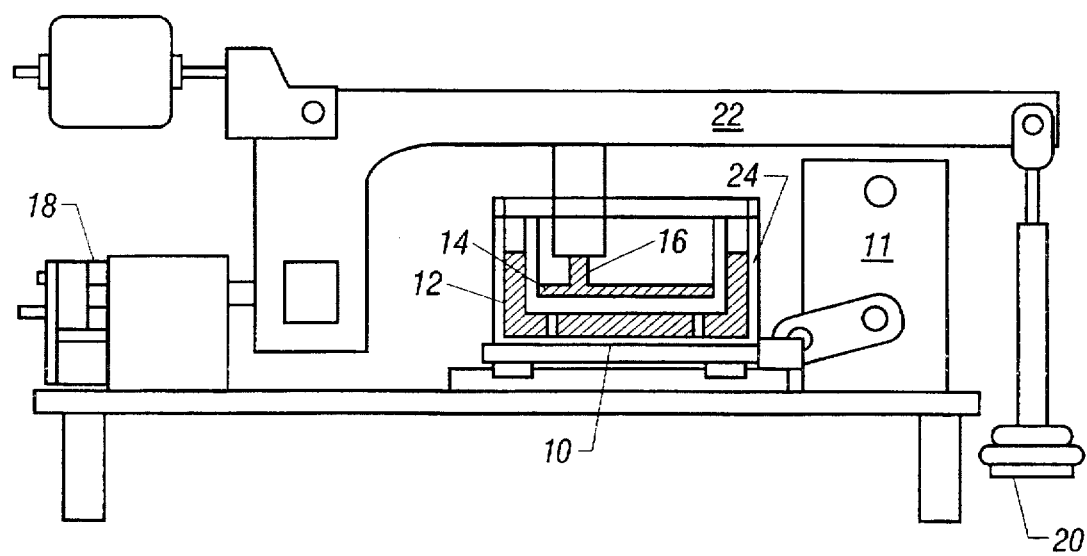
FIG. 1 is a diagrammatic representation of a mixed prospective and cross sectional side view of the wear test machine used in the following experiments.
Figure 2:
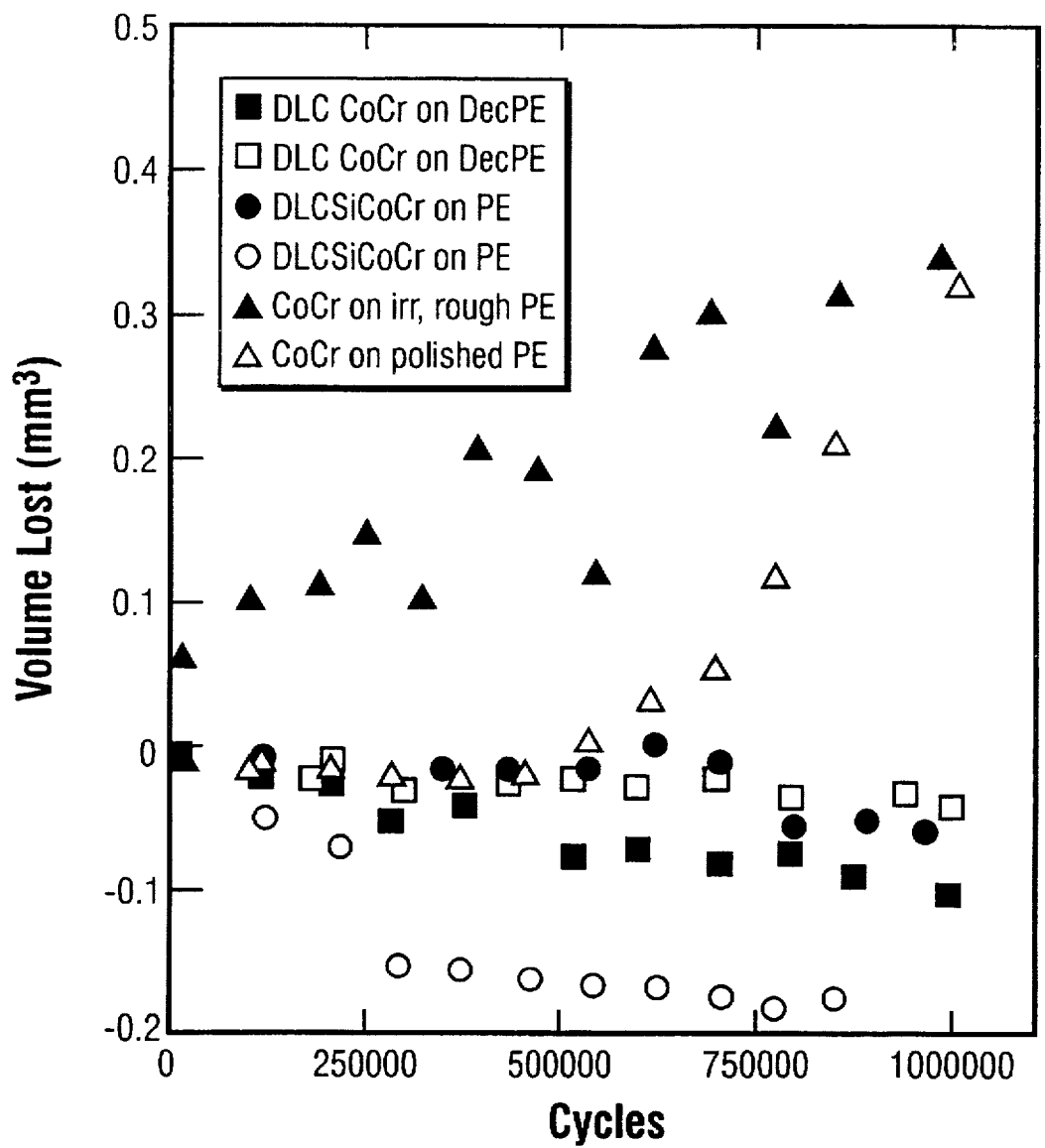
FIG. 2 is a chart of the number of wear cycles against the volume ($mm^3$) lost during those cycles.

The present invention provides a method for strongly adhering a diamond-like carbon coating to the surface of a metal alloy component. The method comprises: exposing the metal alloy substrate to a vacuum; heating the substrate; depositing silicon or germanium onto the substrate while substantially simultaneously bombarding the substrate with a first energetic beam of ions to form an intermetallic bonding layer cohesively bonded to an interlayer of silicon or germanium; condensing a film of diamond-like carbon precursor onto the interlayer of silicon or germanium and substantially simultaneously bombarding the substrate with a second energetic beam of ions to form a silicon or germanium carbide bonding layer cohesively bonded to a coating of diamond-like carbon.

DETAILED DESCRIPTION OF THE INVENTION

The present method for treating a metal alloy to provide a diamond-like carbon coating (DLC) uses ion beam assisted deposition of silicon, germanium, or a combination thereof, followed by ion beam assisted deposition of DLC. Although a combination of silicon and germanium can be used to form the interlayer, it is preferred to use silicon or germanium, alone, because of the difference between the vaporization points of the two materials.

In order to effectively knit together the successive layers of metal-silicon-DLC (or metal-germanium-DLC), it is necessary to supply a bond-interface (a) between the metal and the silicon or germanium, as well as (b) between the silicon or germanium and the DLC. Without limiting the present invention, the invention is believed to achieve this result by forming a gradient in the type of bonds found in progressive layers of material at the surface of the metal alloy. In essence, the gradient is believed to be: intermetallic bonds in the metal alloy substrate; partially metallic and partially covalent bonds between the metal and silicon or germanium in a layer of metal silicide; primarily covalent but somewhat metallic bonds in a layer of silicon or germanium, which strongly coheres to the layer of metal silicide; covalent bonds between the silicon or germanium and carbon atoms in the DLC in a layer of silicon- or germanium carbide; and, covalent bonds in the layer of DLC, which strongly coheres to the layer of silicon or germanium-carbide.

The present invention would work with pure metals as well as metal alloys; however, as a practical matter, a metal must be alloyed in order to form a viable industrial component. Preferred metal substrates are metals that that form strongly-cohesive silicides and germanides. Such metals include cobalt, nickel, titanium, zirconium, chromium, molybdenum, tungsten, platinum, and palladium.

In order to form the gradient of the present invention, the metal alloy component should be cleaned using conventional methods to remove superficial contaminants, such as grease. The clean component should be placed in a vacuum chamber that has been evacuated to a base pressure of preferably less than about $10^{-5}$ torr. The component then should be bombarded with ions, preferably argon ions, at an energy range between about 10–100 keV, preferably around 10 keV. This ion bombardment provides an effective means to remove some of the remaining adsorbed atoms from the surface.

The component should be heated, preferably to a temperature of about 300° C. (148° F.), or, if the material is temperature sensitive, to the highest temperature acceptable for that material. Silicon or germanium then should be deposited onto the component using known means. A preferred means is to position the workpiece directly over a volatilization hearth until a preferred coating thickness of between about 100–200 nm has been achieved. The volatilization hearth should be maintained at about 750° C. (1382° F.) for silicon, and between about 450°–550° C. (232°–288° F.) for germanium. The thickness of the coating may be monitored by standard methods, e.g., using the frequency change of a quartz crystal oscillator.

The component preferably should be substantially simultaneously bombarded with an energetic beam of ions, preferably nitrogen ions, at an energy range between about 500 eV to 100 keV, preferably between about 10–20 keV, in order to form an interlayer of metal-silicide or metal germanide at the metal-silicon/metal-germanium interface.

Nitrogen ions are preferred for the ion beams of the present invention because, when used to accomplish ion beam assisted deposition, nitrogen ions actually bond with the substrate/coating or interlayer. Inert ions, such as argon and/or helium ions, will not bond with the substrate/film. The use of inert ions could result in bubbling and/or a weaker coating. Although it has not been proven, it is believed that strong carbon-nitrogen bonds form in the DLC layer when the ions used to make the DLC are nitrogen ions. In any event, the use of beams of nitrogen ions can result in DLC coatings that increase wear resistance and decrease friction up to 5–7 times more than DLC coatings formed using other types of ions.

Although nitrogen ions are preferred, other ions may be used, such as argon, silicon, methane, helium, or neon. The ion beam should have an energy between about 500 eV to 100 keV, preferably between about 10–30 keV. The "ion arrival ratio"—defined as the ratio of each arriving ion to the number of atoms of silicon, germanium, or DLC precursor present at the surface of the component—preferably should be at least 1:10. The energy and ion arrival ratio should be sufficient to form a strong interlayer of metal silicide and/or metal germanide at the metal-silicon/metal-germanium interface.

Thereafter, the component should be cooled to permit the DLC precursor to condense onto the surface of the component. Generally, the component should be cooled to at least about 80° C. (26° F.), preferably without removing the component from the vacuum chamber. Suitable precursor materials include carbon-based diffusion pump materials which have a low vapor pressure and can be vaporized stably at room temperature. Preferable diffusion pump fluids include, but are not necessarily limited to: polyphenyl ether; polydimethyl siloxane; pentaphenyltrimethyl siloxane; and, elcosyl napthalene. A commonly used and preferred DLC precursor is polyphenyl ether.

Generally, the precursor should be placed in a reservoir, heated to its vaporization point, which for polyphenyl ether is between about 150° C.–170° C. (302° F.–338° F.), and directed onto the cooled component. Substantially simultaneously, the component should be bombarded, either in a continuous or interrupted fashion, with an energetic beam of ions—preferably nitrogen ions. Other suitable ions include, but are not necessarily limited to argon, silicon, methane, helium, or neon. The ion beam should have an energy between about 500 eV to 100 keV, preferably between about 10–30 keV. The energy of bombardment must be sufficient to ionize the constituent molecules in the precursor film, and to rupture the bonds between hydrogen and other atoms, thereby releasing the hydrogen into the surrounding vacuum to be pumped away.

The rate of arrival of the ions, defined as the "ion arrival ratio," should be controlled in relation to the rate of arrival of the precursor molecules. This process should require about one ion for every 100 atoms in the final product coating; however, the required ion-to-atom ratio will vary according to the mass and energy of the ion species. Typically, 100 eV must be deposited for each carbon atom in the coating. The function of this second ion bombardment step is to rupture at least about 80% of the carbon-hydrogen bonds in the precursor, resulting in the formation of a noncrystalline coating of amorphous carbon. The energy dissipated by the energetic ion bombardment during ion beam assisted deposition is in the form of inelastic electronic excitations equivalent to at least about 100 eV for each carbon atom within the deposited coating. This energy dissipation strongly enhances adhesion of the DLC coating by rupturing and subsequently reforming interatomic bonds across the interfaces. Persons of ordinary skill in the art will recognize how to achieve the correct linear energy of transfer in the ionizing process. The procedure should be continued until a thickness of DLC between about 100 nm-10 microns is achieved.

In a preferred orthopaedic embodiment, a metal ball coated with DLC according the foregoing procedure is used in conjunction with an ultra high molecular weight component that has been treated with decahydronaphthalene ($C_{10}H_{18}$, anhydrous), also known as Decalin™, to dissolve away or remove polyethylene fibrils that tend to shear off when exposed to friction. The Decalin™ should be heated to between about 30°–100° C. (86°–212° F.), preferably about 30°–50° C. (86°–122° F.). Once a stable solvent temperature has been reached, the UHMWPE component should be immersed and retained in the solvent for about 30–180 seconds, preferably about 30 seconds. The time of immersion generally should decrease as the temperature of the solvent is increased. Thereafter, the UHMWPE component should be removed from the solvent and allowed to dry. A "naked" UHMWPE component generally should be dried for about 24 hours at room temperature. If the UHMWPE component has areas that are difficult to dry, some relatively mild form of heat or air flow may be helpful to dry the component. After drying, the UHMWPE component should be placed in a standard vacuum chamber and exposed to a vacuum of between about $10^{-1}$–$10^{-5}$ torr, preferably about $10^{-3}$ torr, for a time sufficient to remove residual solvent, preferably at least 8 hours. Thereafter, the UHMWPE component is ready for assembly into an end product and/or for any further treatment(s) that may be required before use, e.g., sterilization.

EXAMPLES

GENERAL EXPERIMENTAL PROCEDURES

Wear Test Machine

The wear test machine used in the following examples provided a versatile means for material wear testing. The machine, which is shown in FIG. 1, was capable of applying user defined load profiles in a temperature controlled environment. Briefly, the wear test machine included a reciprocating table 10 controlled by a drive 11. On the reciprocating table 10 was a water bath 12 which held the plate 14 to be tested. A pin 16, described more fully below, was retained stationary adjacent to or abutting the plate 14 or sample to be tested. The movement and weight exerted on the plate 14 by the pin 16 was controlled by a force transducer 18 and a dead weight 20, as described more fully below.

Reciprocating Motion

Linear reciprocating motion was accomplished by means of the DC servo motor drive 11 (configured in velocity mode) directly coupled to a ball screw driven rail table 10. Stroke length was determined by two magnetic control switches mounted on the front of the machine. A trapezoidal velocity profile was sent to the motor as a voltage from a Mackintosh IIci equipped with a data acquisition board and software using a LabVIEW software development system (National Instruments, Austin, Tex.). This trapezoidal velocity profile was under closed loop control using the magnetic control switches as position feedback. The speed of reciprocation was controlled by the magnitude of the trapezoidal voltage signal sent from the Mac IIci.

Load Profiles

Static loads were applied using dead weights 20 placed on the end of a stainless steel beam 22. The normal force on the pin 16 was calculated to be 1.9 times the weight of the dead weights 20 on the end of the beam 22. The maximum static normal force on the pin as 43.7 pounds (194.4N) |due to 23 pounds (102.3N) located at the end of the beam 22|.

Force Measurements

Frictional force recordings between the pin and the plate were obtained from a piezoelectric, voltage mode force transducer. Since the capacity of the force transducer was 100 lbs (444.8N), very small force measurements could be inaccurate. Normal force recordings on the pin 16 were obtained from a piezoelectric, voltage mode force transducer 18. Its capacity also was 100 lbs (444.8N).

Cycle Count

The number of cycles was counted in two places. On the Mac IIci, a software counter was incremented each time the left magnetic control switch was closed. As a hardware backup mechanism, a separate magnetic switch (which used the same power supply as the control switches) was located on the back of the wear machine to increment an electronic counter.

Temperature

The temperature of the wear environment could be regulated by means of a water bath 12 which surrounded the stainless steel wear chamber 24. The water bath 12 was heated by a stainless steel immersion heater controlled by a temperature controller. Water temperature was measured with an RTD probe placed in the bath.

Safety

Since it was desirable for the wear machine to operate overnight and on weekends without supervision, a number of safety mechanisms were used.

Software Control

The computer program which drove the system had a "stop switch" on the screen which enabled the program to be manually stopped at any time. Also, the program continually sampled from two additional magnetic stop switches inside the reciprocating rail table. Therefore, in the event of the stroke length being exceeded, one of these switches would close and the program would be stopped. These two stop switches were located slightly outside of the desired stroke length of the wear test (which was determined by the two magnetic control switches previously discussed).

Hardware Control

Located outside of these stop switches were two industrial mechanical push button switches placed in series between the main power source and the motor drives. These switches normally were closed.

If the reciprocating table 10 traveled too far beyond the desired stroke length of the wear test, one of the magnetic stop switches closed, which caused the computer program to send zero volts to both DC motors 11, stopping the wear test. However, a very small voltage still was sent to the motors 11 from the computer, to which the velocity-configured motor 11 could respond. Therefore, the wear chamber 24 continued slowly to drift and soon engaged one mechanical stop switch. This engagement turned off the main power to the motors 11.

Evaluation of Wear

Evaluation of wear resistance and the associated coefficient of sliding friction was performed under realistic environmental but static loading conditions. Two types of wear were measured. First, the wear represented by loss of the coating from the substrate, which was quantified in terms of the number of cycles required to expose the substrate, or major portions thereof. This determination was most effectively made by microscopic observation, rather than by weight loss.

In cases where no coating was involved, it was useful to monitor weight loss; however, it was imperative to compensate for environmental fluid uptake (gain in mass) of the wear sample by using a dummy sample presoaked and exposed to the test bath simultaneously alongside the wear specimen. To ensure that trends observed in the data represented a steady state situation, data was obtained over a period approaching $10^6$ cycles (corresponding to about one year of normal ambulation). Later tests completed about $1.25 \times 10^6$ cycles.

Simulation of Joint Environment

The environment of a natural joint (with synovial fluid) was simulated using bovine serum. Pin/plate materials were chosen based on a judgment that the constraints of the total joint design cause a localized sector of the femoral ball to describe a wide path within the socket of the acetabular component. Eventually, as seen in joint simulator experiments, a millimeter or more of polymer may be worn away, with no measurable loss of material by the metal or ceramic ball. Therefore, these tests utilized metal, ceramic, or coated metal pins run against coated or uncoated polymeric plates.

Polyethylene

The virgin UHMWPE that was used in the following examples was obtained from Westlakes Plastics, Lenni, Pa. For purposes of the present study, gamma-ray sterilization was not performed. If such sterilization had been performed, then the sterilization process should have produced a marginal improvement of mechanical performance, as a consequence of cross-linking. Because the surface of polyethylene is scratched easily, all of the surfaces and materials were kept scrupulously clean using a laminar air-flow cabinet. A Struers Rotopol polisher with a Pedamat head was used to polish the samples according to the procedure given in Table I:

TABLE I

Polishing of Polyethylene

| Step | Abrasive | Applied Load | Duration |
| --- | --- | --- | --- |
| 1. | 400 grit SiC | 100 N | 2 min. repeat once |
| 2. | 600 grit SiC | 100 N | 2 min. repeat once |
| 3. | 1200 grit SiC | 100 N | 2 min. repeat once |
| 4. | 2400 grit SiC | 100 N | 2 min. repeat once |
| 5. | 4000 grit SiC | 100 N | 2 min. repeat once |
| 6. | 1 μm Diamond Spray on Pan-w Cloth* | 80 N | 5 min. repeat until scratches are gone |

*Pan-w is a cardboard like cloth made by STRUERS.

The alloy was manufactured by Carpenter Technology, Houston, Tex., and had the following composition: cobalt 70/chromium 30, with a minor addition of molybdenum. After machining, the 10 mm diameter test pins were contoured at one end to a radius of 20 mm and polished by standard metallurgical techniques. The curvature was designed to prevent the edge of the pin from cutting into the surface of the polyethylene flat.

Wear testing was performed using the wear test machine described above. The temperature was maintained within the test chamber at 23±1° C. by means of an external water bath 12. The chamber containing the sample plate 14 was reciprocated beneath the stationary pin 16 at 1 Hz over a sliding distance of 50.8 mm per cycle; both sliding speed and distance approximate that which obtains during service within a total hip joint. Cobalt-chromium-molybdenum and alumina pins 16 were machined to a 20 mm radius (similar to that of typical femoral balls) and polished metallographically to obtain a surface finish of less than 0.05 um $R_a$.

Samples were soaked in pairs (wear specimen plus dummy) for one week in bovine serum with sodium azide in a 0.1 vol. % solution, the latter to prevent bacterial growth. Subsequent wear testing was performed in the same solution, and the soaked control specimen was used to correct for fluid weight gain in the wear sample. Samples were weighed periodically during testing, and corresponding associated friction coefficients (ratio of linear force to normal load) were measured during sliding.

The desired test load, and that used for most experiments, corresponded to a stress level induced by normal body loads at a total hip interface. Since the articulating pin-on-plate wear surfaces did not conform to the degree of the actual prosthesis, the required equivalent stress loads were lower. In particular, using the measured plastic impression within a UHMWPE plate as a measure of contact area, the approximate equivalent (stress) load was 33.4N.

Tests generally were run for $10^6$ cycles, with wear defined in terms of cumulative mass (volume) loss. Samples were examined by scanning electron microscopy (SEM) at the conclusion of the test.

Example 1

A DLC coating of approximately 1 micron in thickness was formed on CoCr pins by nitrogen ion bombardment of polyphenyl ether precursor deposited using the procedures described above. The pins were cleaned in isopropyl alcohol prior to coating. Isopropyl alcohol was chosen because it leaves few, if any, residues. Wear testing revealed that, under some circumstances, there could be a loss of adhesion of the coating.

Example 2

A batch of four CoCr pins was treated using a bond-coat of silicon. After conventional cleaning of the pins to remove superficial contaminants, the pins were placed in a vacuum chamber evacuated to a base pressure of $10^{-5}$ torr. The pins were cleaned by bombardment with argon ions at an energy of 10 keV. The pins were heated to a temperature of about 300° C. (148° F.), and positioned directly over a volatilization hearth containing silicon maintained at a temperature of 750° C. (1382° F.) until a coating of silicon having a thickness of about 100 nm was achieved. The thickness of the coating was monitored using the frequency change of a quartz crystal oscillator. The pins were substantially simultaneously bombarded with an energetic beam of argon ions at about 15 keV and at an ion arrival ratio of at least 1:10. Thereafter, the pins were cooled in the vacuum chamber to about 80° C. (26° F.).

Polyphenyl ether was placed in a reservoir, heated to about 150° C. (302° F.), and the resulting vapor was directed onto the cooled pins. Substantially simultaneously, the component was bombarded with an energetic beam of argon ions at an energy of about 20 keV and an ion arrival ratio of about 1:100 atoms in the final product coating, or at about 100 eV for each carbon atom in the coating. The procedure was continued until a thickness of DLC of about 0.5 microns was achieved.

In prolonged wear tests, at a contact pressure of 6.9 MPa against UHMWPE under serum, i.e., load and environmental conditions equivalent to walking, no decohesion or loss of DLC was observed after 1.25 million reciprocated wear cycles.

Conclusions

DLC coated CoCr against polyethylene clearly represents a considerable advantage over uncoated CoCr against polyethylene. From the appearance of the DLC-UHMWPE contact surface, it appears that localized adhesion takes place as the DLC rider passes over the polyethylene surface, possibly pulling out the soft (lower molecular weight) constituent on a gradual cyclic basis. However, the adhesive contact force is insufficient to fail the pulled out microstructure, at least before $1.25 \times 10^6$ cycles.

Example 3

A batch of four CoCr pins is treated using a bond-coat of germanium. After conventional cleaning of the pins to remove superficial contaminants, the pins are placed in a vacuum chamber that has been evacuated to a base pressure of $10^{-5}$ torr. The pins then are cleaned by bombardment with argon ions at an energy of 10 keV. The pins are heated to a temperature of about 300° C. (148° F.), and positioned directly over a volatilization hearth containing germanium maintained at about 450° C. (232° F.) until a coating of germanium having thickness of about 100 nm is achieved. The thickness of the coating is monitored using the frequency change of a quartz crystal oscillator. The pins are substantially simultaneously bombarded with an energetic beam of nitrogen ions at about 15 keV and at an ion arrival ratio of at least 1:10. Thereafter, the pins are cooled in the vacuum chamber to about 80° C. (26° F.).

Polyphenyl ether is placed in a reservoir, heated to about 150° C. (302° F.), and the resulting vapor is directed onto the cooled pins. Substantially simultaneously, the component is bombarded with an energetic beam of nitrogen ions at an energy of about 20 keV and an ion arrival ratio of about 1:100 atoms in the final product coating, or at about 100 eV for each carbon atom in the coating. The procedure is continued until a thickness of DLC of about 100 nm is achieved. Subsequent wear testing demonstrates enhanced wear resistance.

Persons of ordinary skill in the art will recognize that many modifications may be made to the present invention without departing from the spirit and scope of the present invention. The embodiment described herein is meant to be illustrative only and should not be taken as limiting the invention, which is defined in the following claims.

We claim:

1. A method for coating an outer surface of a metal alloy substrate with diamond-like carbon comprising:

exposing said metal alloy substrate to a vacuum of at least about $10^{-5}$ torr;

heating said substrate to a first temperature of about 300° C. (149° F.) or, if said metal alloy is temperature sensitive, to a highest temperature acceptable for said metal alloy;

depositing an intermediate material selected from the group consisting of silicon and germanium onto said substrate in an amount sufficient to form an intermetallic bonding layer at said outer surface of said substrate cohesively bonded to an outer interlayer of said intermediate material;

substantially simultaneously bombarding said intermediate material with a first energetic beam of ions at a first energy, a first ion arrival ratio, and for a first amount of time sufficient to form said intermetallic bonding layer cohesively bonded to said interlayer;

condensing a diamond-like carbon precursor onto said interlayer at a second temperature and for a second amount of time sufficient to form a film of precursor molecules on said interlayer;

substantially simultaneously bombarding said diamond-like carbon precursor with a second energetic beam of ions at a second energy, a second ion arrival ratio, and for a third amount of time sufficient to form a carbide bonding layer cohesively bonded to a coating of diamond-like carbon.

2. A method for coating an outer surface of a metal alloy substrate with diamond-like carbon comprising:

providing a substrate comprised of a metal alloy selected from the group consisting of cobalt, nickel, titanium, zirconium, chromium, molybdenum, tungsten, platinum, palladium, and combinations thereof;

exposing said substrate to a vacuum of at least about $10^{-5}$ torr;

heating said substrate to a first temperature of about 300° C. (149° F.) or, if said metal alloy is temperature sensitive, to a highest temperature acceptable for said metal alloy;

depositing an intermediate material selected from the group consisting of silicon and germanium onto said substrate in an amount sufficient to form an intermetallic bonding layer at said outer surface of said substrate cohesively bonded to an outer interlayer of said intermediate material;

substantially simultaneously bombarding said intermediate material with a first energetic beam of ions at a first energy, a first ion arrival ratio, and for a first amount of time sufficient to form said intermetallic bonding layer cohesively bonded to said interlayer;

condensing a diamond-like carbon precursor onto said interlayer at a second temperature and for a second amount of time sufficient to form a film of precursor molecules on said interlayer;

substantially simultaneously bombarding said diamond-like carbon precursor with a second energetic beam of ions at a second energy, a second ion arrival ratio, and for a third amount of time sufficient to form a carbide bonding layer cohesively bonded to a coating of diamond-like carbon.

3. The method of claim 1 wherein said first and second beam of ions comprise ions selected from the group consisting of nitrogen, argon, silicon, methane, helium, neon, and combinations thereof.

4. The method of claim 1 wherein said second beam of ions comprises nitrogen ions.

5. The method of claim 2 wherein said second beam of ions comprises nitrogen ions.

6. The method of claim 1 wherein said first energy and said second energy are between about 10–30 keV.

7. The method of claim 2 wherein said first energy and said second energy are between about 10–30 keV.

8. The method of claim 1 wherein said second temperature is about 80° C. (26° F.).

9. The method of claim 2 wherein said second temperature is about 80° C. (26° F.).

10. The method of claim 4 wherein said second temperature is about 80° C. (26° F.).

11. The method of claim 1 wherein said intermediate material is deposited onto said substrate to a thickness of between about 100–200 nm.

12. The method of claim 2 wherein said intermediate material is deposited onto said substrate to a thickness of between about 100–200 nm.

13. The method of claim 3 wherein said intermediate material is deposited onto said substrate to a thickness of between about 100–200 nm.

14. A method for making an orthopaedic implant comprising an outer surface of a metal alloy substrate in frictional contact with an ultra-high molecular weight polyethylene component, said method comprising the steps of:

providing an orthopaedic component comprising a metal alloy substrate selected from the group consisting of cobalt, nickel, titanium, zirconium, chromium, molybdenum, tungsten, platinum, palladium, and combinations thereof;

exposing said substrate to a vacuum of at least about $10^{-5}$ torr;

heating said substrate to a first temperature of about 300° C. (149° F.) or, if said metal alloy is temperature sensitive, to a highest temperature acceptable for said metal alloy;

depositing an intermediate material selected from the group consisting of silicon and germanium onto said substrate in an amount sufficient to form an intermetallic bonding layer at said outer surface of said substrate cohesively bonded to an outer interlayer of said intermediate material;

substantially simultaneously bombarding said intermediate material with a first energetic beam of ions at a first energy, a first ion arrival ratio, and for a first amount of time sufficient to form said intermetallic bonding layer cohesively bonded to said interlayer;

condensing a diamond-like carbon precursor onto said interlayer at a second temperature and for a second amount of time sufficient to form a film of precursor molecules on said interlayer;

substantially simultaneously bombarding said diamond-like carbon precursor with a second energetic beam of ions at a second energy, a second ion arrival ratio, and for a third amount of time sufficient to form a carbide bonding layer cohesively bonded to a coating of diamond-like carbon.

* * * * *